United States Patent [19]

Ten Pierick et al.

[11] Patent Number: 5,051,608
[45] Date of Patent: Sep. 24, 1991

[54] CIRCUIT ARRANGEMENT FOR SUPPLYING A PERIODIC, SUBSTANTIALLY PARABOLIC SIGNAL

[75] Inventors: Hendrik Ten Pierick; Kar B. Chan; Steven J. Koelewijn, all of Eindhoven, Netherlands

[73] Assignee: U.S. Philips Corporation, New York, N.Y.

[21] Appl. No.: 507,946

[22] Filed: Apr. 10, 1990

[30] Foreign Application Priority Data

May 8, 1989 [NL] Netherlands ............. 8901147

[51] Int. Cl.⁵ .......... H03K 5/00; H03K 5/12; G06G 7/12; G09G 1/04
[52] U.S. Cl. .................. 307/261; 307/263; 307/228; 307/490; 307/494; 328/36; 328/127; 315/371; 315/384
[58] Field of Search ............ 307/261, 263, 268, 228, 307/490, 494; 328/36, 187, 127; 315/371, 384

[56] References Cited

U.S. PATENT DOCUMENTS 4,849,652  7/1989  Hulshof .................. 307/261

FOREIGN PATENT DOCUMENTS 0273497  7/1988  European Pat. Off.
0301633  2/1989  European Pat. Off.

Primary Examiner—Stanley D. Miller
Assistant Examiner—Trong Phan
Attorney, Agent, or Firm—Edward W. Goodman

[57] ABSTRACT

Circuit arrangement including a parabolic generator for supplying a periodic, substantially parabolic signal to an output terminal during a trace time and an arcuate signal generator for supplying an arcuate signal, which has the shape of, for example, a half sine wave, during a retrace time. At the start of the retrace time, the arcuate signal and its derivatives are given values which are substantially equal to the corresponding values of the parabolic signal at the end of the trace time. The arcuate signal generator is adapted to generate the arcuate signal in a time-discrete manner under the control of switching pulses supplied by a pulse circuit. The pulse circuit is adapted to supply a constant number of switching pulses for generating the arcuate signal in spite of variations in the retrace time, so that the arcuate signal and its derivative assume values which are substantially equal to the corresponding values of the parabolic signal at the start of the trace time.

6 Claims, 4 Drawing Sheets

RETRACE TIME

CIRCUIT ARRANGEMENT FOR SUPPLYING A PERIODIC, SUBSTANTIALLY PARABOLIC SIGNAL

BACKGROUND OF THE INVENTION

1. Field of the Invention

The invention relates to a circuit arrangement for supplying a periodic, substantially parabolic signal to an output terminal, which arrangement comprises a sawtooth generator for supplying a periodic sawtooth signal having a period comprising a trace time and a retrace time, a parabolic generator having an input for receiving the sawtooth signal and an output for supplying a substantially parabolic signal to the output terminal of the circuit arrangement during the trace time, and an arcuate signal generator for supplying an arcuate signal to the output terminal during the retrace time of the sawtooth signal, while at the start of the retrace time, the arcuate signal and its derivative with respect to time are given values which are substantially equal to corresponding values of the substantially parabolic signal at the end of the trace time. An arcuate signal is herein understood to mean a signal having the shape of an arch, for example, half a period of a sine wave or a part of a parabola.

2. Description of the Related Art

A circuit arrangement of this type is known from European Patent Application no. 0,273,497 (PHN 11.964) and is used, for example, for generating a control signal of an east-west modulator in a picture display device and/or for the dynamic focusing in such an arrangement. This control signal may have the field frequency (50 Hz in accordance with the European standard) or the line frequency (15.625 kHz in accordance with the said standard) or any other suitable frequency.

To prevent ringing effects of resonant circuits in the east-west modulator or in the dynamic focusing circuit to a maximum possible extent, the known circuit arrangement ensures that the arcuate signal and the parabolic signal and their derivatives continuously merge. In the known circuit arrangement, this is achieved in that the arcuate signal and its derivative with respect to time are given values at the start of the retrace time corresponding to the values of the parabolic signal and its derivative at the end of the trace time. Furthermore, the natural frequency of the arcuate signal is chosen to be such that the arcuate signal and its derivative assume values at the end of the retrace time corresponding to the values of the parabolic signal at the start of the trace time.

A drawback of the known circuit arrangement is that it is not very well possible to vary the duration of the retrace time because then the continuity between the arcuate signal and the parabolic signal at the end of the retrace time is lost. It is often desirable that the retrace time should be variable or adjustable, for example, in multi-standard picture display devices, or that the centering of the displayed picture should be adjustable.

In the generally known method of centering the sawtooth signal, a DC component is added so that the center of the picture information is displayed in the center of the display screen. If this offset sawtooth signal is squared for the purpose of east-west correction, a parabola is produced with the start and the end not being at the same level. This is undesirable because a symmetrical east-west correction is necessary. The trace time is therefore preferably varied so that the picture information is also offset on the display screen. However, this produces an opposite variation of the retrace time.

SUMMARY OF THE INVENTION

It is an object of the invention to provide a circuit arrangement in which the retrace time can be varied arbitrarily, while the generated acurate signal and the parabolic signal, as well as their derivatives with respect to time, always continuously merge, both at the transition from trace time to retrace time and at the transition from retrace time to trace time. To this end the circuit arrangement according to the invention is characterized in that the arcuate signal generator is adapted to generate the arcuate signal in a time-discrete manner under the control of switching pulses supplied by a pulse circuit, and in that the pulse circuit is adapted to supply such a constant number of switching pulses for generating the arcuate signal at a variable retrace time that the arcuate signal and its derivative with respect to time assume values at the end of the retrace time, which values are substantially equal to the corresponding values of the substantially parabolic signal at the start of the trace time.

Due to the measure according to the invention both the output signal of the circuit arrangement and its derivative are substantially continuous functions of time at arbitrary frequencies of the sawtooth signal and at arbitrary ratios between trace time and retrace time, thus generally at arbitrary values of the retrace time.

It is known per se from European Patent Application no. 0,301,633, corresponding to U.S. Pat. No. 4,891,565, to generate a sawtooth signal with a constant number of switching pulses during the trace time. However, the reason for generating such a signal is completely different from that of the present invention, namely for obtaining a constant amplitude of the sawtooth signal.

The circuit arrangement according to the invention is advantageously characterized in that the pulse circuit is adapted to generate switching pulses under the control of a clock coupled to a reference frequency, this pulse circuit having an input for receiving a control signal representing the number of periods of the reference frequency comprised in the retrace time, the pulse circuit further including a programmable divider for dividing the clock by the control signal and for supplying the switching pulses. In this way, the required switching pulses are obtained in a simple and easily monolithically integrable manner.

An embodiment according to the invention is characterized i that the pulse circuit is adapted to supply switching pulses having a first period duration during the trace time and a second period duration during the retrace time, the ratio between the two periods being constant. As a result, the frequency of the switching pulses during the trace time is inversely proportional to the duration of the retrace time. This embodiment has the advantage that it is possible, without any extra control mechanisms, to generate an arcuate signal during the retrace time which is continuously contiguous to the parabolic signal during the trace time and whose derivatives are also continuously contiguous.

BRIEF DESCRIPTION OF THE DRAWINGS

The invention will now be described in greater detail by way of example with reference to the accompanying drawings, in which.

DESCRIPTION OF THE PREFERRED EMBODIMENT

Figure 1:
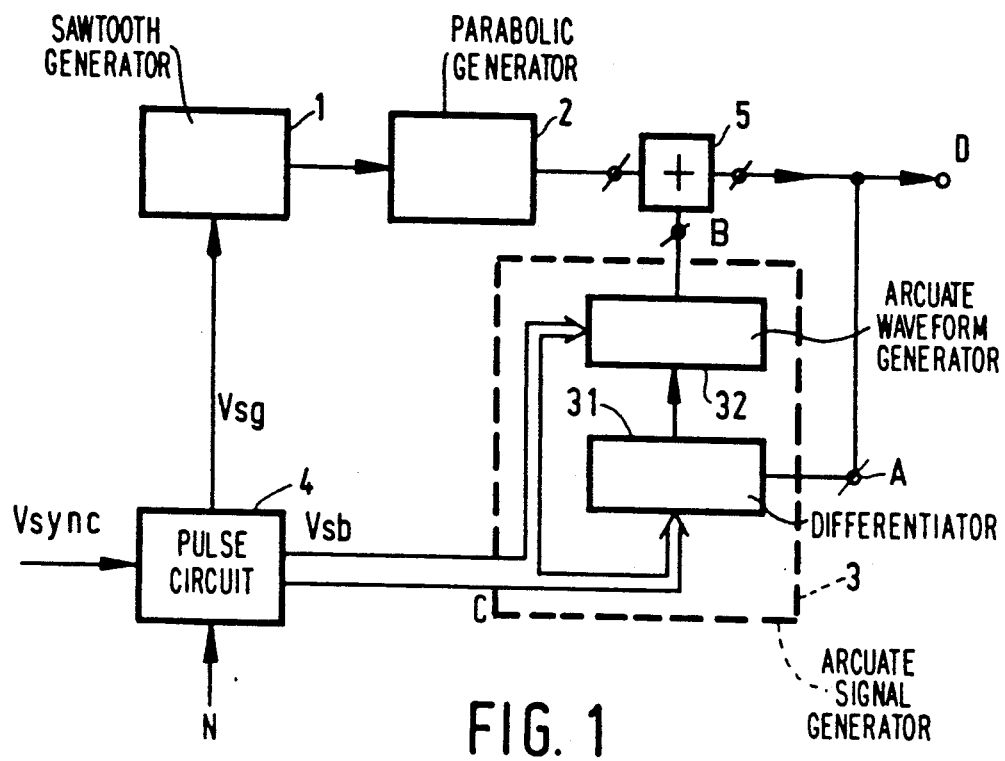
FIG. 1 is a simplified circuit diagram of a circuit arrangement according to the invention.

FIG. 1 is a basic circuit diagram of the circuit arrangement according to the invention. A sawtooth generator 1 generates a sawtooth signal which comprises in known manner a trace time and a retrace time. This sawtooth signal is applied to a parabolic generator 2 which converts this signal, at least during the trace time, by means of squaring to a parabolic signal for the east-west correction. This parabolic signal is applied to an adder circuit 5. An arcuate signal generator 3 generates an arcuate signal during the retrace time and this arcuate signal is applied via an output B to the adder circuit 5 which adds this arcuate signal to the parabolic signal. Therefore, a signal is available at the output D of the adder circuit which comprises the parabolic signal from the parabolic generator 2 during the trace time and the arcuate signal originating from the arcuate signal generator during the retrace time. This output signal may be used, or example, for the east-west correction.

As will be further described, the retrace time can be varied. According to one aspect of the invention, the arcuate signal generator 3 has such a construction that, independent of the duration of the retrace time, the parabolic signal and the arcuate signal always continuously merge and that the derivatives of the two signals also continuously merge. To this end the arcuate signal generator 3 comprises a differentiator 31 and an arcuate waveform generator 32. The differentiator 31, which is connected to the output of the adder circuit 5 via an input A and which thus receives the parabolic signal, determines the derivative of the parabolic signal at the end of the trace time and applies this derivative to the arcuate waveform generator 32. The arcuate waveform generator 32 uses this derivative for generating an arcuate signal whose value and its derivative at the start of the retrace time are contiguous to that of the parabolic signal at the end of the trace time. The input A of the differentiator 31 may alternatively be connected to the output of the parabolic generator 2.

The sawtooth generator 1 and the arcuate signal generator 3 are controlled by a pulse circuit 4 which receives the field-synchronizing pulse Vsync and a control signal N which is a measure of correcting the centering. With reference to the signal Vsync, the pulse circuit 4 determines the starting instant of the retrace time and, with reference to the two input signals, the pulse circuit 4 determines the starting instant of the trace time of the sawtooth signal.

Figure 1A:
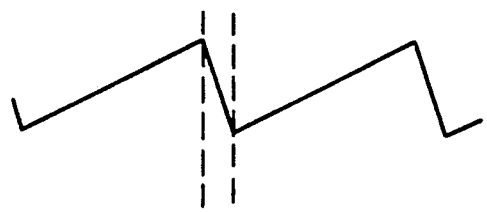
FIGS. 1a–1d show signal waveforms at various points in the circuit of FIG. 1.
Figure 1B:
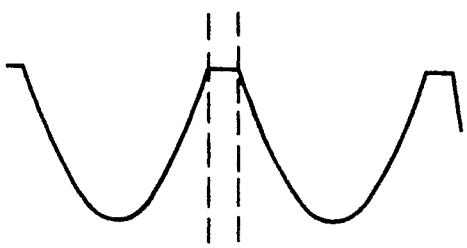
Figure 1C:
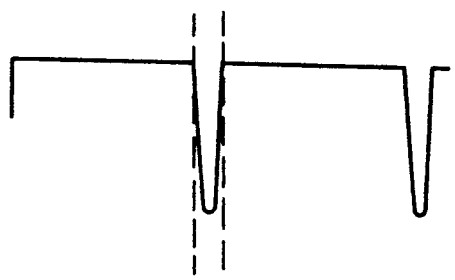
Figure 1D:
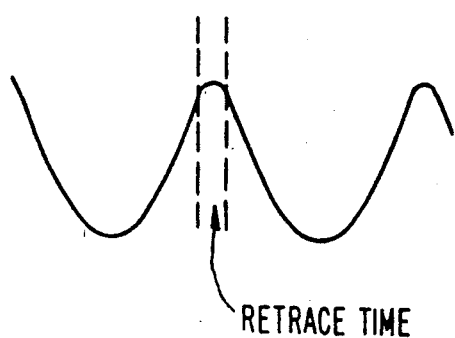

FIG. 1a show the sawtooth signal generated by the sawtooth generator 1; FIG. 1b shows the parabolic signal at the output of the parabolic generator 2; FIG. 2c shows the arcuate signal at the output of the arcuate signal generator 3; FIG. 1d shows the signal at the output of adder 5, which is the output of the circuit arrangement according to the invention.

Figure 2:
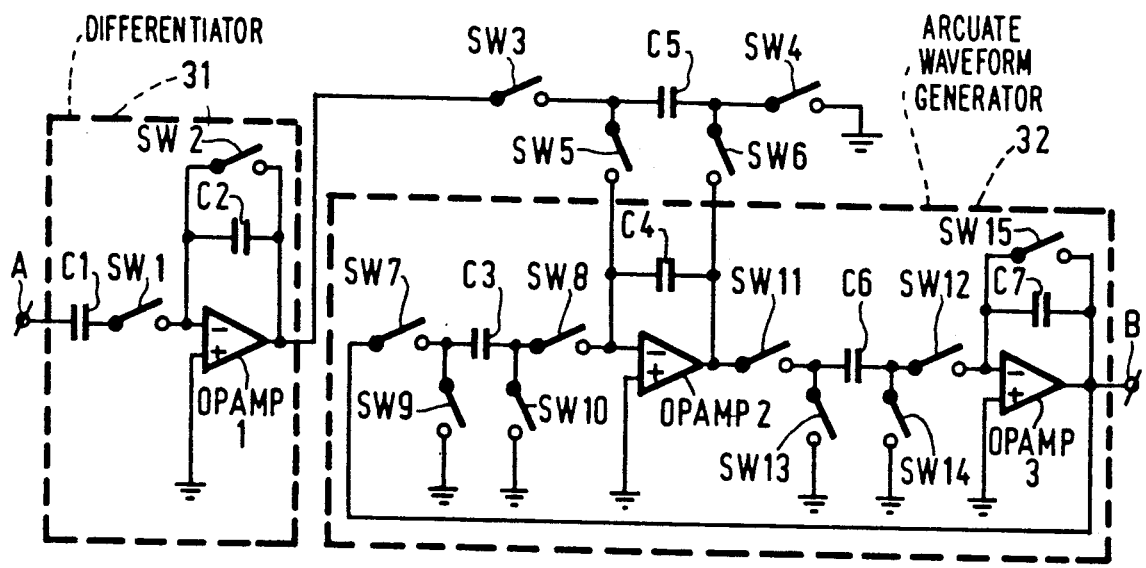
FIG. 2 is a detailed circuit diagram of an arcuate signal generator or use in a circuit arrangement according to the invention.

FIG. 2 shows an embodiment of the arcuate signal generator 3 in which the corresponding elements of FIG. 1 have the same reference numerals. This arcuate signal generator comprises switched capacitors.

FIG. 2 shows a plurality of switches all of which are controlled from the pulse circuit 4 via an input C in a manner which is not further shown in this Figure.

Figure 2A:
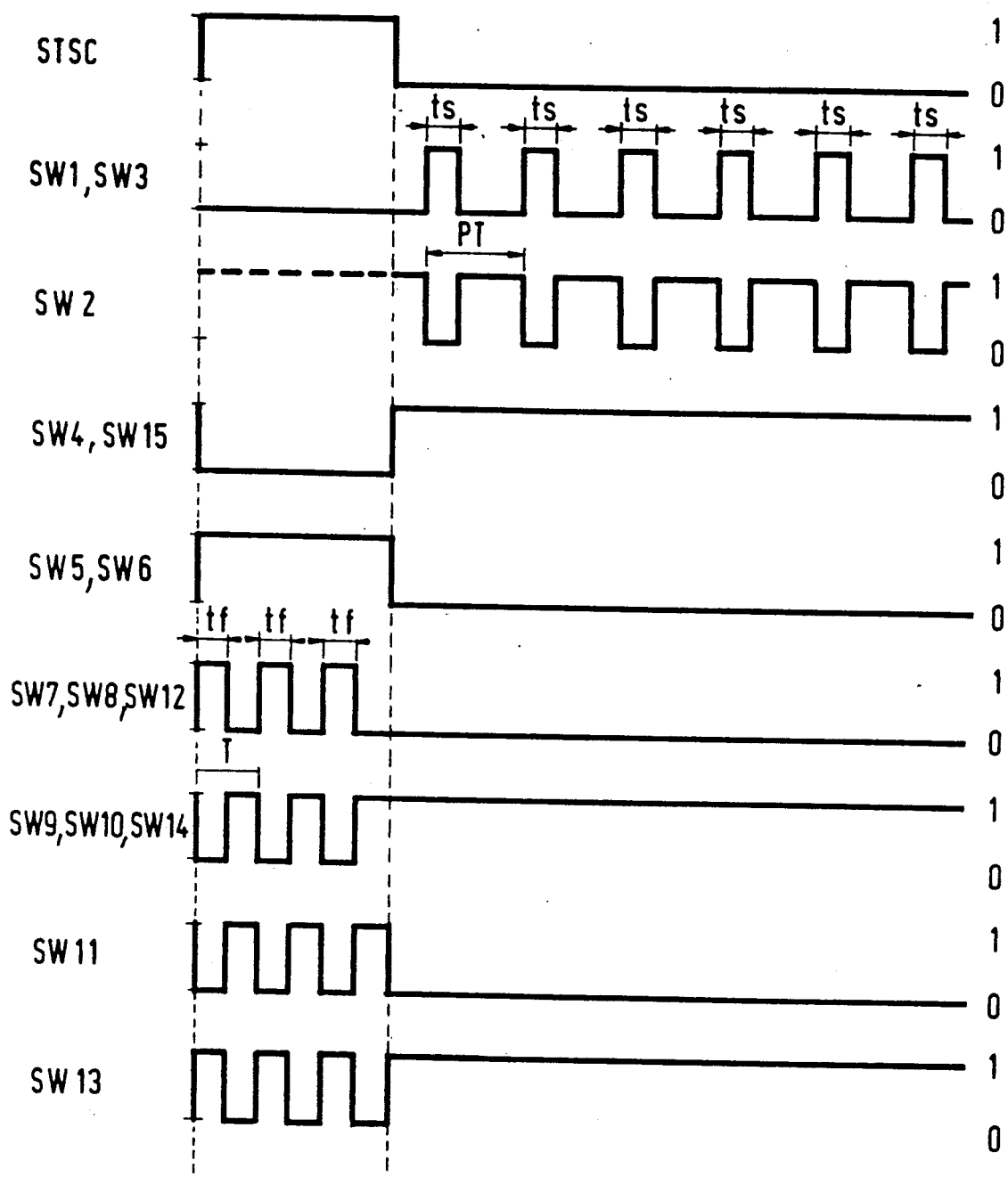
FIG. 2a shows switching phases of the switches of FIG. 2

FIG. 2a shows the switching phases of these switches. The period in which the switches are switched is subdivided into the retrace time and the trace time. A signal STSC indicates this subdivision and during the retrace time this signal is high (1) and during the trace time it is low (0). High implies that the switches are closed and low implies that they are open. The switches SW1 and SW3 switch synchronously during the trace time and are closed during sampling periods ts, while they are open between these sampling periods and during the retrace time. The switch SW2 switches in phase opposition with respect to the switches SW1 and SW3. The switches SW4 and SW15 are closed during the entire trace time and open during the entire retrace time. The switches SW5 and SW6 switch in phase opposition with the switches SW4 and SW15. The switches SW7, SW8 and SW12 switch synchronously during the retrace time and are closed during periods tf, while the are open during the intermediate periods which are preferably as long as the periods tf. These switches are open during the trace time. The switches SW9, SW10 and SW14 switch in phase opposition with the switches SW7, SW8 and SW12. The switch SW11 switches synchronously with the switches SW9, SW10 and SW14 during the retrace time and is open during the entire trace time. The switch SW13 switches synchronously with the switches SW7, SW8 and SW12 during the retrace time and is closed during the entire trace time.

To simplify the illustration, FIG. 2a shows a too low number of pulses during the trace time and during the retrace time. In practice these numbers are usually much larger.

The parabolic signal is received at the input A of FIG. 2 during the trace time. During the trace time, this signal is differentiated in the differentiator 31. The differentiator 31 includes a capacitor C1 a terminal of which is connected to the input A and the other terminal of which is connected to one side of a switch SW1, while the other side of this switch is connected to an inverting input of an operational amplifier OPAMP1. The non-inverting input of the operational amplifier OPAMP1 is connected to ground. During the so-called sampling period ts the switch SW1 is closed and during the rest of the period it is open. The inverting input of the operational amplifier OPAMP1 is also connected to an output of this amplifier via a second capacitor C2. A second switch SW2, which is open during the sampling periods, and is closed during the rest of the period is arranged parallel to this capacitor C2. At the sampling periods, i.e. when the switch SW1 is closed and the switch SW2 is open, the input signal is present across the capacitor C1 because the non-inverting input of the operational amplifier OPAMP1 is virtually connected to ground. Since the capacitor C2 is short-circuited after each sampling, the derivative of the input signal is obtained at the output of the operational amplifier OPAMP1, the derivative being multiplied by a factor of P*C1/C2. The value P is the ratio between the duration of the period of the switching pulses during the trace time (PT) and the duration of the period of the switching pulses during the retrace time. By choosing this ratio as a fixed value, the derivative is always multiplied in such a manner that the arcuate signal acquires the correct value. As will be described hereinafter, the pulse circuit of FIG. 1 provides this fixed ratio between the duration of the period of the switching pulses during the trace time and the duration of the period of the switching pulses during the retrace time. This derivative is required as an input signal for the arcuate waveform generator 32 which generates the arcuate signal. The sampling of the derivative is stored via a switch SW3 in a third capacitor C5 which is connected to the output of the operational amplifier OPAMP1. The switch SW3 is closed and opened synchronously with the switch SW1. The other terminal of the capacitor C5 is connected to ground via a switch SW4 throughout the trace time. During the retrace time, in which the switches SW1, SW3 and SW4 are open, the differentiator 31 does not operate and the arcuate waveform generator 32 generates the arcuate signal. The arcuate waveform generator 32 comprises two integrators. This arcuate waveform generator 32 receives the derivative of the parabolic signal at the start of the retrace time, which signal is obtained by means of the capacitor C5 which is parallel to a capacitor C4 via two switches SW5 and SW6 during the retrace time. A terminal of the capacitor C4 is connected to an inverting input of a second operational amplifier OPAMP2 and the other terminal is connected to the output of the operational amplifier OPAMP2. This capacitor C4 is required to prevent the second operational amplifier OPAMP2 from getting into an open loop during the trace time when the switches SW5 and SW6 are open.

The output of the operational amplifier OPAMP2 is connected to a capacitor C6 via a switch SW11 which is periodically opened during the periods tf and closed during the intermediate periods. The junction point between the switch SW11 and the capacitor C6 is connected to a switch, SW13 which is closed and opened synchronously with the switch SW11 but in an opposite manner, i.e. if the switch SW11 is open, the switch SW13 is closed, and vice versa. The other end of the switch SW13 is connected to ground. The other terminal of the capacitor C6 is connected to an inverting input of an operational amplifier OPAMP3 via a switch SW12. The switch SW12 is closed and opened synchronously with the switch SW13 during the retrace time. The junction point between the capacitor C6 and the switch SW12 is connected to a switch SW14 which is opened and closed synchronously with the switch SW11 and the other end of which is connected to ground.

The non-inverting input of the operational amplifier OPAMP3 is connected to ground. The inverting input of operational amplifier OPAMP3 is connected to a capacitor C7, the other terminal of which is connected to the output of the operational amplifier OPAMP3, which output is also the output B of the arcuate signal generator 3. A switch SW15, which is open during the retrace time and closed during the trace time, is arranged parallel to the capacitor C7. The output of the operational amplifier OPAMP3 is also fed back via a switch SW7 which is connected to the inverting input of the operational amplifier OPAMP2 via a capacitor C3 and a switch SW8. The switches SW7 and SW8 are closed and opened synchronously with the switch SW12. The junction point between the switch SW7 and the capacitor C3 is connected to a switch SW9 the other end of which is connected to ground. The junction point between the capacitor C3 and the switch SW8 is connected to a switch SW10 the other end of which is connected to ground. The switches SW9 and SW10 are closed and opened synchronously with the switch SW14.

Starting from the parabolic signal received at the input A during the trace time, the arcuate signal generator 3 shown in FIG. 2 generates the arcuate signal. After differentiation of the input signal in the differentiator 31, the arcuate signal is generated in the arcuate waveform generator 32 by the two integrators which are each constituted by an operational amplifier and a plurality of switches. After the first integration, i.e. at the output of the operational amplifier OPAMP2, a sinusoidal signal is produced whose phase differs ninety degrees from the sinusoidal arcuate signal which is produced at the output of the second integrator, i.e. at the output of the operational amplifier OPAMP3.

In the manner described above an arcuate signal is obtained with a derivative at the start which is equal to the derivative at the end of the parabolic signal. However, it should also be ensured that the derivative at the end of the arcuate signal is always equal to the derivative at the start of the parabolic signal by varying the retrace time. If this were effected in a corresponding manner, i.e. if the derivative of the arcuate signal were determined and if it were applied to the parabolic generator for influencing the derivative at the start of the parabolic signal, this would lead to a variation of the amplitude of the parabolic signal and hence to an incorrect east-west correction. In accordance with one aspect of the invention, this can be prevented by varying the frequency of the switching pulses tf when varying the retrace time, and this in such a manner that the number of switching pulses tf during the retrace time remains constant at a given, correctly chosen value.

Figure 3:
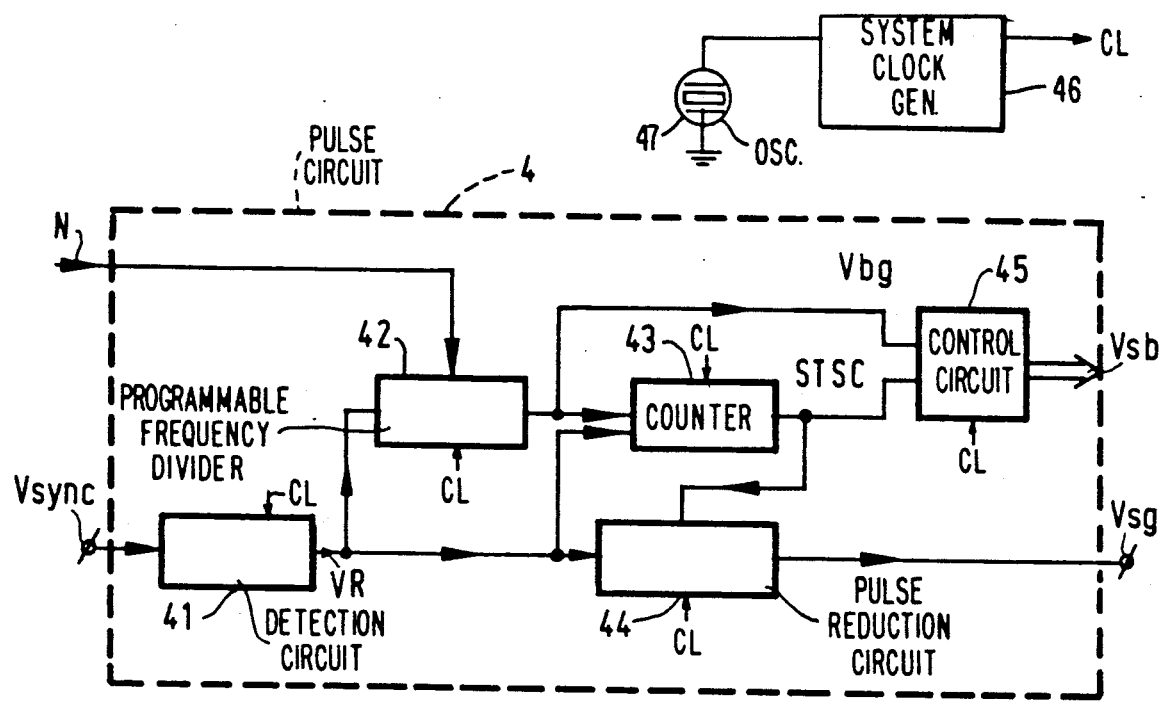
FIG. 3 is a more extensive circuit diagram of the pulse circuit.

FIG. 3, which is an elaborated circuit diagram of the pulse circuit 4 (of FIG. 1) will, illustrate the way in which this is effected. A clock signal generator 46, coupled to the output of a reference frequency oscillator 47, generates a system clock for the pulse circuit 4. The system clock, having a frequency of 432 times the line frequency, is applied to all components of the pulse circuit 4. The pulse circuit receives the field-synchronizing signal Vsync at an input, which signal originates, for example, from a sync separator which is not further shown. A second input of this pulse circuit( receives the control signal N which is, for example, a measure of the centering correction. This signal N represents an integer indicating the number & of line periods covered by the retrace time and may be applied, for example, via an I²C bus. A first output signal Vsg of this pulse circuit 4 controls the sawtooth generator 1. A second output signal Vsb is conveyed by a plurality of signal leads controlling the switches of the arcuate signal generator 3 in the manner shown in FIG. 2a.

The signal Vsync is applied to a detection circuit 41 detecting the instant when a field-synchronizing signal is received. This detection circuit supplies a signal VR after detecting a synchronizing pulse. The signal VR is applied as a reset signal to a programmable frequency divider 42. This frequency divider 42 receives the signal N as a second input signal which determines the division. The frequency divider 42 divides the system clock frequency by 6N. As a result, a signal Vbg, having a frequency of 72/N times the line frequency, is produced at the output of the frequency divider 42, which implies that, independent of the duration of the retrace, 72 pulses will occur during the retrace. The signal Vbg is applied to a counter 43 which is reset by the signal VR at the start of the retrace time and which subsequently counts 72 pulses of this signal Vbg. As a result, the signal STSC is produced, which is high during N line periods, i.e the field retrace time, and which is low during the rest of the period. The signal STSC is the signal showing the distinction between the trace time and the retrace time in FIG. 2a. This signal STSC is applied to a pulse reduction circuit 44 which may be implemented in the way as is shown in the afore-mentioned European Patent Application no. 0,301,633 (PHN 12.193), corresponding to U.S. Pat. No. 4,891,565, and which is herein incorporated by reference. Independent of variations of the system clock frequency and of the length of the trace time, the pulse reduction circuit 44 supplies a fixed number of pulses during the trace time, which results in the output signal Vsg controlling the sawtooth generator 1. The signal VR operates as a reset signal also for this pulse reduction circuit 44.

The signal STSC and the signal Vbg are also applied to a control circuit 45 which determines the switching phases (as shown in FIG. 2a) for the switches of FIG. 2 (and FIG. 4, respectively) with reference to these two signals. Particularly this control circuit 45 divides the frequencies in such a way that the duration of the period of the switching pulses during the trace time is P times as long as the duration of the period of the switching pulses during the retrace time. The reference P is the previously mentioned fixed ratio by which the derivative of the parabolic signal is multiplied in such a way that the arcuate signal is always continuously contiguous to the parabolic signal and the derivatives are also continuously contiguous. The output Vsb of this control circuit comprises a plurality of signal leads controlling the switches. The input signal N influences the length of the field retrace time, while the number of pulses is maintained constant during the retrace time and only the frequency of the pulses is adapted. This adaptation is effected in such a manner that the number of lines during the retrace time is varied dependent on the necessary centering correction. By maintaining the number of pulses during the retrace time constant, for example, 72 (chosen in one embodiment in which the arcuate signal had a reasonably smooth variation upon simulations) it is relatively simple in the arcuate waveform generator 32 (namely by a correct dimensioning of the capacitances of the capacitors C3 to C7 in FIG. 2) to generate such an arcuate signal that this signal at the end of the retrace time is continuously contiguous to the parabolic signal during the trace time and that the derivatives of these signals also merge continuously.

Figure 4:
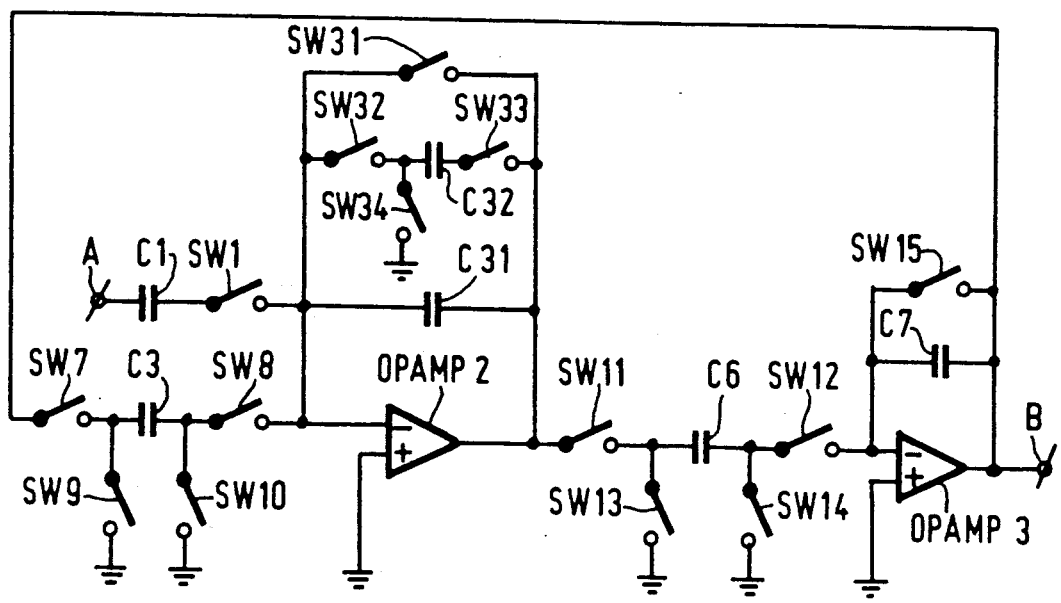
FIG. 4 is a second detailed circuit diagram of an arcuate signal generator for use in a circuit arrangement according to the invention.

FIG. 4 shows an embodiment of an arcuate signal generator 3 in a concise form. Corresponding elements of FIG. 2 have the same reference numerals. The switches SW31, SW33, SW34 and SW32 have the same switching phases as the switches SW2, SW3, SW4 and SW5, respectively, of FIG. 2. The arcuate signal generator 3 receives the parabolic signal for the east-west correction at an input A. Here again the derivative of this signal is determined at the end of the trace time. As in FIG. 2, the signal is present across the capacitor C1 at the sampling instants ts, i.e. when the switch SW1 is closed, but in this embodiment the switch SW1 is connected to the input of the operational operational amplifier OPAMP2 OPAMP2. This amplifier has a dual function in this embodiment, because it forms part of the differentiator 31 during the trace time so as to determine the derivative of the input signal and during the retrace time it forms part of an integrator of the arcuate waveform generator 32 which generates the arcuate signal.

As stated, the input signal is differentiated during the trace time and the switches SW7, SW8, SW11, SW12 and SW32 are open so that the arcuate waveform generator 32 does not operate. During the trace time the switches SW9, SW10, SW13, SW14 and SW15 are closed so as to initiate the capacitors C3, C6 and C7 at zero, likewise as in FIG. 2. Thus, the differentiator 31 comprises the capacitor C1 which is connected to the inverting input of the operational amplifier OPAMP2 via the switch SW1 which is closed at the sampling periods ts. The non-inverting input of operational amplifier OPAMP2 is connected to ground. Furthermore, the inverting input is connected to a terminal of a capacitor C3% and the other terminal of capacitor C31 is connected to the output of the amplifier OPAMP2. A switch SW31, which is open during the sampling periods is and closed during intermediate periods, is arranged parallel to the capacitor C31. To retain the derivative of the input signal, the output of the operational amplifier OPAMP2 is connected to a capacitor C32 via a switch SW33 which is closed at the sampling periods ts and open during the intermediate periods, while the other terminal of the capacitor C32 is connected to ground via a switch SW34 which is closed throughout the trace time. The derivative of the input signal is thereby stored in the capacitor C32. This derivative is used during the retrace time for generating the arcuate signal with the correct derivative at the start.

During the retrace time, the switches SW1, SW15, SW31 and SW34 are open. The switches SW32 and SW33 are closed throughout the retrace time. In this embodiment, a half sine wave is generated again, starting from the initial condition, i e. the voltage across the capacitor C32. The switches SW7, SW8, SW12 and SW13 are synchronously switched during the retrace time and are closed during the periods tf and opened during preferably equal intermediate periods. The switches SW9, SW10, SW11 and SW14 are opened and closed synchronously but in phase opposition with the switches SW7, SW8, SW12 and SW13, which implies that these switches are open when the switches SW7, SW8, SW12 and SW13 are closed, and vice versa. As a result the sinusoidal arcuate signal is produced at the output B.

It is to be noted that it is similarly possible to generate an arcuate signal having a different shape, for example, a part of a parabola or a part of a half sine wave by means of switched capacitors during the retrace time, which signal also continuously varies with, for example, the signal for the east-west correction during the trace time, and that the derivatives of the signals also vary continuously. It is also to be noted that fully digital timediscrete embodiments instead of switched capacitor embodiments are alternatively possible.

What is claimed is:

1. A circuit arrangement for supplying a periodic, substantially parabolic signal to an output terminal, said circuit arrangement including a sawtooth generator for supplying a periodic sawtooth signal having a period with a trace time and a retract time, said sawtooth generator having a control input for receiving a control signal for triggering starting instants of said trace time and said retrace time, a parabolic generator having an input for receiving the sawtooth signal and an output for supplying the substantially parabolic signal to the output terminal during the trace time, and an arcuate signal generator for supplying an arcuate signal to the output terminal during the retrace time of the sawtooth signal, wherein at a start of a retrace time; the arcuate signal and a derivative with respect to time of the arcuate signal are given respective values which are substantially equal to corresponding values of the substantially parabolic signal and a derivative with respect to time of the substantially parabolic signal, respectively, at an end of a preceding trace time, characterized in that said circuit arrangement further comprises a pulse circuit for generating the control signal for said sawtooth generator and for generating switching pulses, a predetermined number of said switching pulses occurring during said retrace time, and the arcuate signal generator comprises means for generating the arcuate signal in response to said parabolic signal and said switching pulses, whereby at an end of the retrace time, the arcuate signal and the derivative with respect to time of the arcuate signal have respective values which are substantially equal to corresponding values of the substantially parabolic signal and the derivative with respect to time of the substantially parabolic signal, respectively, at a start of a following trace time.

2. A circuit arrangement as claimed in claim 1, characterized in that the pulse circuit generates the switching pulses under control of a clock coupled to a reference frequency, said pulse circuit having an input for receiving a control value representing a number of periods of the reference frequency which are to occur within the retrace time, and a programmable divider having a divisor input coupled to the input of the pulse circuit for receiving the control value, a dividend input for receiving the clock, and an output coupled to an output of the pulse circuit for supplying the switching pulses.

3. A circuit arrangement as claimed in claim 2, wherein the arcuate signal generator includes a differentiator, coupled to receive said parabolic signal, for generating a differentiator output signal which is a measure of the derivative of the substantially parabolic signal at the tend of the trace time, and an arcuate waveform generator, coupled to receive the differentiator output signal, for generating the arcuate signal during the retrace time, characterized in that said differentiator comprises capacitors coupled between an input and an output thereof, and switches for selectively connecting and selectively shorting said capacitors, and said arcuate waveform generator comprises capacitors coupled between an input and and output thereof, and switches for selectively connecting, selectively shorting, and selectively connecting, selectively shorting, and said differentiator and said arcuate waveform generator being controlled by said switching pulses.

4. A circuit arrangement as claimed in claim 3, in which said switching pulses include a switching signal which switches on the differentiator and switches off the arcuate waveform generator during the trace time, and, conversely, switches off the differentiator and switches on the arcuate waveform generator during the retrace time, characterized in that said pulse circuit further comprises a counter coupled to the output of said programmable divider for generating said switching signal, said counter being reset at the start of the retrace time and counting the pulses at the output of the programmable divider until said predetermined number of switching pulses is reached.

5. A circuit arrangement as claimed in claim 3, characterized in that the capacitors in the arcuate waveform generator form two serially arranged integrators, and the capacitors in one of said two serially integrators form, by the operation of selected ones of said switches, said differentiator during the trace time.

6. A circuit arrangement as claimed in claim 1, characterized in that said pulse circuit supplies the switching pulses with a first pulse-period duration during the trace time and a second pulse-period duration during the retrace time, a ratio between said first pulse-period duration and said second pulse-period duration being constant.

* * * * *